United States Patent [19]

Grapentin et al.

[11] Patent Number: 5,019,229

[45] Date of Patent: May 28, 1991

[54] METHOD OF CONTROLLING EPOXY RESIN ETCHANT ION CONCENTRATION

[75] Inventors: Hans-Joachim Grapentin; Tomas Kayser; Andrea Riedl, all of Berlin, Fed. Rep. of Germany

[73] Assignee: Schering Aktiengesellschaft, Berlin and Bergkamen, Fed. Rep. of Germany

[21] Appl. No.: 375,716

[22] Filed: Jul. 5, 1989

[30] Foreign Application Priority Data

Jul. 5, 1988 [DE] Fed. Rep. of Germany ....... 3823137

[51] Int. Cl.$^5$ ............................. C25F 5/00; C25F 7/02; B44C 1/22; B44C 15/00
[52] U.S. Cl. .............................. 204/130; 204/153.15; 204/153.16; 156/627; 156/642; 156/644; 156/668; 156/902
[58] Field of Search ........... 204/129.2, 129.55, 129.75, 204/130, 1 T, 400, 153.15, 153.16; 156/642, 644, 668, 627, 902

[56] References Cited

U.S. PATENT DOCUMENTS

| | | | |
|---|---|---|---|
| 2,782,151 | 2/1957 | Suthard | 204/433 |
| 3,547,785 | 12/1970 | Sakuma | 204/130 X |
| 3,874,959 | 4/1975 | Hoekstra | 204/129.2 X |
| 4,036,704 | 7/1977 | Takata | 204/1 T |
| 4,468,305 | 8/1984 | Hillis | 204/130 |
| 4,756,930 | 7/1988 | Kukanskis et al. | 156/668 X |
| 4,853,095 | 8/1989 | D'Ambrisi | 204/82 |
| 4,859,300 | 8/1989 | Sullivan et al. | 204/164 |
| 4,948,630 | 8/1990 | Courduvelis et al. | 156/668 X |

Primary Examiner—Donald R. Valentine
Attorney, Agent, or Firm—Michael J. Striker

[57] ABSTRACT

A method of and an apparatus for etching an epoxy resin having a high backetching rate, in particular bores with printed circuit boards, with stable, strong, basic alkaline permanganate etching solution wherein the solution is stablized by electrochemical anodal oxidation, and permanganate and OH-ion concentration is controlled by measuring the same by using electrochemical and/or photometric measuring method with subsequent metering of the solution in accordance with deviation of a measurement value from a nominal value.

10 Claims, 1 Drawing Sheet

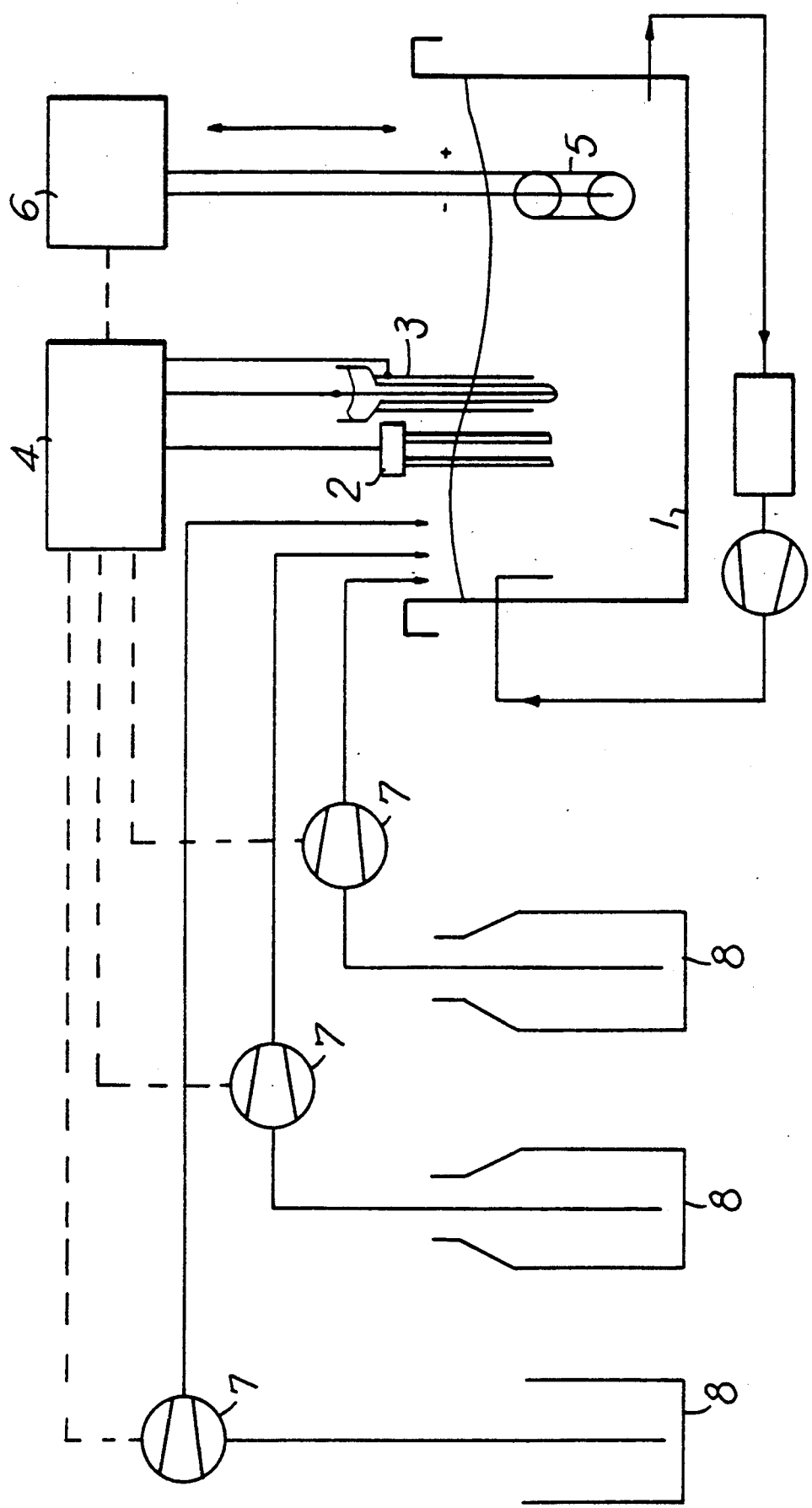

METHOD OF CONTROLLING EPOXY RESIN ETCHANT ION CONCENTRATION

BACKGROUND OF THE INVENTION

The invention relates to a method of etching an epoxy resin having a high backetching rate, in particular when etching bores with printed circuit boards, when using stable, strong, basic alkaline permanganate etching solution.

When manufacturing multilayer circuits, it is necessary to carry out a preliminary process to remove resin smears resulting from forming a bore. The removal of these smears should insure a reliable contact of conducting multilayers-copper inner layers with a chemically formed copper coating. The purification of the bore effected by removal of epoxide, with simultaneous roughening of the outer surface of the substrate, insures in addition a better adhesion which, with a deenergized metal coating or coating obtained by direct electrolysis. This is important above all because of the thermal load which the circuit board is exposed to during subsequent soldering.

It is known to carry out the above-mentioned preliminary process with alkaline potassium or sodium permanganate solutions, when, as a rule, before oxidation, conditioning with an organic solvent and/or a surface-active agent is carried out, which however requires significant treatment time. Because, in most cases, only small backetching rates are achieved, it has already been proposed to increase the backetching rates, for example, by:

using ultrasound;
increase of the temperature;
increase of the concentration of permanganate by using sodium permanganate;
increase of OH-ion concentration.

This, however, results either in the damage of the base material or in a strong destabilization of the permanganate system.

SUMMARY OF THE INVENTION

The object of the invention is to provide a method which will make possible a better etching of expoxy resin having a high backetching rate while simultaneously insuring stabilization of the permanganate system and a constant concentration. The object of the invention is achieved by providing a method of etching an epoxy resin having a high backetching rate with stable, strong basic alkaline permanganate etching solution, in which the permanganate etching solution is stabilized by electrochemical anodal oxidation; and permanganate and OH-ion concentration is controlled by measuring the same by using electrochemical and/or photometric concentration measurement methods with subsequent metering of the solution upon deviation of a measurement value from a nominal value.

The foregoing method permits to attain a backetching rate greater than 3 um.

Generally, a permanganate etching solution containing at least 30 g/liter and preferably 60–200 g/liter, of alkali hydroxide, is used.

The permanganate etching solution generally contains 10–100 g/liter of alkaline permanganate.

The electrochemical anodal oxidation is effected generally with a direct current voltage of 0.5–0.25 volt and a current density of $0.1-20 \text{ A/dm}^2$.

The permanganate etching solution concentration is measured photoelectrically with an immersion probe comprising a photoelement. A current signal representative of a concentration change is directed to an operational amplifier which actuates in a known manner, solution metering means in accordance with the current signal. The current signal is changed directly proportionally to a concentration change.

The concentration can also be measured by measuring alkali hydroxide with redox measuring means and directing a measurement signal to an operational amplifier having an output for outputting a current signal for actuating in a known manner solution metering means in accordance with the measurement signal. This current signal decreases or increases in accordance with decrease or increase in concentration.

The method according to the invention achieves a previously unattainable stabilization of a high alkaline permanganate etching solution which allows use of such a solution to obtain a stronger backetching and roughing of an epoxy resin.

Another advantage of the method according to the invention consists in that practically unlimited useful life of such etching solution having a high alkalinity and, therefore, a higher etching rate can be attained. The method according to the invention permits for the first time to effect practically backetching of an epoxy resin with permanganate solution.

A further advantage of the method of the invention consists, in addition, in that it permits to provide so-called 3-point-copper-attachment on inner layers of multilayer circuits.

An apparatus for implementing the method of the invention may preferably comprise two electrolyte containers separated by a diaphragm, one for an anolyte and the other for catholyte.

For controlling and measuring of permanganate concentration advantageously a device described in German Patent Application P 37 16 013.-3 is used.

The present invention both as to its construction so to its mode of operation, together with additional objects and advantages thereof, will be best understood from the following detailed description of the invention when read in connection with the accompanying drawings.

BRIEF DESCRIPTION OF THE DRAWINGS

The single FIGURE of the drawings shows schematically an apparatus for implementing the method according to the present invention.

DETAILED DESCRIPTION OF THE PREFERRED EMBODIMENT

The apparatus for etching an epoxy resin shown in the only FIGURE of the drawings comprises an operating preferably two-container reservoir 1 filled with a permanganate etching solution. An immersion probe 2 with a photoelement and a redox measuring device connected with control device 4 measure concentration of permanganate and OH-ions. The control device 4 also controls a transformator 6 which operates the anodal oxidation apparatus 5. The control device 4 further controls a plurality of metering pumps 7 which supply the etching solution from a respective plurality of solution storage containers to the reservoir 1.

The alkaline permanganate etching solution from storage containers 8 is pumped by pumps 7 into the operating reservoir 1. Upon the reservoir 1 having been filled to a predetermined level the anodal oxidation is effected. The reservoir for and the process of anodal oxidation are described in details in U.S. patent application Ser. No. 195,240 filed May 11, 1988, entitled "METHOD OF REGENERATION OF PERMANGANATE ETCHING SOLUTION AND A DEVICE FOR CARRYING OUT THE METHOD", and incorporated herein by reference thereto. The immersion probe 2 and the redox measurement device measure concentration of permanganate and OH-ions in the operating reservoir and communicate the measurement signals to the control device 4 which, upon deviation of the measurement signals from nominal values, actuates one or more of the pumps 7.

The method of the invention will now be explained by way of an example.

EXAMPLE

Usually, a conventional epoxy resin (FR4) having a TG-point about 135° C. is used. Because etching rates per surface determined by conventional published so-called "Weight Loss" method deviate from values obtained empirically, they would be determined for microsection surfaces whereat the difference between the epoxy resin and the glass or copper inside layer would be taken as a basic practical backetching rate.

The following potassium permanganate etching solution was used:
60 g/liter KMnO$_4$
70 g/liter NaOH
0.1 g/liter fluorate wetting agent.

The solution density at 70° C. was 1.08 g/cm$^3$. The epoxide etching rate was determined after fifteen (15) minute treatment. After practically throughput of a 4 m$^2$/l of a blank (printed circuit board), the solution had to be discarded because of formation of a strong bottom deposit having a density of 1.38 g/cm$^3$ at 70° C. and a smaller etching rate of the epoxyde (<2 um).

The experiment was repeated with stabilization of the etching solution by anodal oxidation with anode current density of 6 A/dm$^2$ and with modification of the concentration of Potassium permanganate between 55 and 60 g/liter, and Potassium manganate between: 15 and 17 g/liter by means of photometric measurement and respective metering of the substances.

After the new experiment, the following values were obtained:
Density at 70° C.: 1.068 g/cm$^3$
Epoxide rate: 17 um
After throughput of 20 m$^2$/l of a printed circuit board:
Density at 70° C.: 1.08 g/cm$^2$
Epoxide etching rate: 16 um While the invention has been illustrated and described as embodied in a method of etching an epoxy resin, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A method of etching an epoxy resin having a high backetching rate, in particular bores with printed circuit boards, with stable, strong basic alkaline permanganate etching solution, said method comprising the steps of
   a. providing a permanganate etching solution;
   b. stabilizing the permanganate etching solution by electrochemical anodal oxidation with a direct current voltage of 0.5 to 0.25 volt and a current density of 0.1 to 20 A/dm$^2$;
   c. controlling permanganate and OH-ion concentration by measuring the same by using at least one of electrochemical concentration measurement and photometric concentration measurement, and by metering the solution in accordance with deviation of a measurement value from a nominal value; and
   d. effecting etching of the epoxy resin with a back-etching rate of greater than 3 um.

2. A method as set forth in claim 1 wherein said step of providing a permanganate etching solution includes providing a permanganate etching solution containing 60–200 g/liter of akalihydroxide.

3. A method as set forth in claim 1 wherein the step of providing a permanganate etching solution includes providing a solution containing 10–100 g/liter of alkaline permanganate.

4. A method as set forth in claim 1 wherein said concentration controlling step includes measuring the permanganate etching solution concentration photometrically with an immersion probe comprising a photoelement, directing a current signal representative of a concentration change to an operative amplifier, and actuating solution metering means in accordance with said current signal.

5. A method as set forth in claim 4 wherein said current signal is changed directly proportionally to a concentration change.

6. A method as set forth in claim 1 wherein said concentration controlling step includes measuring alkalihydroxide with redox measuring means and directing a measurement signal to an operative amplifier having an output for outputting a current signal for actuating solution metering means in accordance with the measurement signal.

7. A method as set forth in claim 6 wherein said current signal decreases or increases in accordance with decrease or increase in concentration.

8. A method of etching an epoxy resin having a high backetching rate, in particular bores with printed circuit boards, with stable, strong basic alkaline permanganate etching solution, said method comprising the steps of
   a. providing a permanganate etching solution containing 10 to 100 g/liter of alkaline permanganate;
   b. stabilizing the permanganate etching solution by electrochemical anodal oxidation;
   c. controlling permanganate and OH-ion concentration by measuring the same by using at least one of electrochemical concentration measurement and photometric concentration measurement, and by metering the solution in accordance with deviation of a measurement value from a nominal value; and
   d. effecting etching of the epoxy resin with a back-etching rate of greater than 3 um.

9. A method as set forth in claim 8, wherein the permanganate etching solution contains at least 30 g/liter of alkali hydroxide.

10. A method as set forth in claim 8 wherein said stabilizing step includes effecting electrochemical anodal oxidation with a direct current voltage of 0.5–0.25 volt and a current density of 0.1–20 A/dm$^2$.

* * * * *